US009799628B2

(12) United States Patent
Kim et al.

(10) Patent No.: US 9,799,628 B2
(45) Date of Patent: Oct. 24, 2017

(54) STACKED PACKAGE CONFIGURATIONS AND METHODS OF MAKING THE SAME

(71) Applicant: QUALCOMM Incorporated, San Diego, CA (US)

(72) Inventors: Dong Wook Kim, San Diego, CA (US); Hong Bok We, San Diego, CA (US); Jae Sik Lee, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/043,484

(22) Filed: Feb. 12, 2016

(65) Prior Publication Data
US 2016/0293574 A1    Oct. 6, 2016

Related U.S. Application Data

(60) Provisional application No. 62/141,139, filed on Mar. 31, 2015.

(51) Int. Cl.
| | |
|---|---|
| *H01L 25/065* | (2006.01) |
| *H01L 21/56* | (2006.01) |
| *H01L 23/31* | (2006.01) |
| *H01L 25/00* | (2006.01) |
| *H01L 23/00* | (2006.01) |

(52) U.S. Cl.
CPC ........ *H01L 25/0652* (2013.01); *H01L 21/565* (2013.01); *H01L 23/3114* (2013.01); *H01L 24/14* (2013.01); *H01L 24/16* (2013.01); *H01L 24/17* (2013.01); *H01L 24/49* (2013.01); *H01L 24/73* (2013.01); *H01L 24/92* (2013.01); *H01L 25/0657* (2013.01); *H01L 25/50* (2013.01); *H01L 24/11* (2013.01); *H01L 24/13* (2013.01); *H01L 24/32* (2013.01); *H01L 24/48* (2013.01); *H01L 2224/1146* (2013.01); *H01L 2224/12105* (2013.01); *H01L 2224/131* (2013.01); *H01L 2224/13147* (2013.01);
(Continued)

(58) Field of Classification Search
CPC .................................................. H01L 25/0652
See application file for complete search history.

(56) References Cited

U.S. PATENT DOCUMENTS 7,550,835 B2 *  6/2009  Kang ................... H01L 25/0657
                                                  257/686
7,843,052 B1    11/2010  Yoo et al.
(Continued)

OTHER PUBLICATIONS

International Search Report and Written Opinion—PCT/US2016/024952—ISA/EPO—dated Jul. 1, 2016.

*Primary Examiner* — Eugene Lee
(74) *Attorney, Agent, or Firm* — Muncy, Geissler, Olds & Lowe, (57) ABSTRACT

Some examples of the disclosure may include a package on package integrated package configuration including a first die located above the substrate in a first plane, a second die located above the first die in a second plane with a portion extending past the first die, a third die located above the first die in the second plane with a portion extending past the first die, a fourth die located above the second die and the third die in a third plane with a portion extending past the second die and the third die, and a fifth die located above the second die and the third die in the third plane with a portion extending past the second die and the third die.

14 Claims, 11 Drawing Sheets

(52) U.S. Cl.
CPC ............ *H01L 2224/14151* (2013.01); *H01L 2224/14155* (2013.01); *H01L 2224/1624* (2013.01); *H01L 2224/16145* (2013.01); *H01L 2224/16227* (2013.01); *H01L 2224/16237* (2013.01); *H01L 2224/171* (2013.01); *H01L 2224/32145* (2013.01); *H01L 2224/48227* (2013.01); *H01L 2224/49173* (2013.01); *H01L 2224/73203* (2013.01); *H01L 2224/73253* (2013.01); *H01L 2224/73265* (2013.01); *H01L 2224/81191* (2013.01); *H01L 2224/81192* (2013.01); *H01L 2224/92* (2013.01); *H01L 2225/0651* (2013.01); *H01L 2225/06513* (2013.01); *H01L 2225/06517* (2013.01); *H01L 2225/06555* (2013.01); *H01L 2924/00014* (2013.01); *H01L 2924/1431* (2013.01); *H01L 2924/1434* (2013.01); *H01L 2924/15311* (2013.01); *H01L 2924/181* (2013.01)

(56) References Cited

U.S. PATENT DOCUMENTS

| | | |
|---|---|---|
| 9,093,153 B2 | 7/2015 | Zhang |
| 9,093,291 B2 | 7/2015 | Haba et al. |
| 2008/0157393 A1 | 7/2008 | Kodama et al. |
| 2012/0074546 A1* | 3/2012 | Chong .................. H01L 21/561 257/676 |
| 2013/0009308 A1 | 1/2013 | Kwon |
| 2013/0015586 A1 | 1/2013 | Crisp et al. |
| 2013/0187292 A1* | 7/2013 | Semmelmeyer .... H01L 25/0652 257/777 |
| 2014/0117354 A1* | 5/2014 | Kim ........................ H01L 25/18 257/48 |
| 2014/0175673 A1* | 6/2014 | Kim ........................ H01L 24/73 257/777 |
| 2014/0203457 A1* | 7/2014 | Kim ........................ H01L 25/18 257/778 |
| 2015/0061110 A1* | 3/2015 | Hsu .................... H01L 25/0657 257/713 |
| 2015/0091179 A1 | 4/2015 | Shenoy et al. |
| 2015/0108656 A1 | 4/2015 | Juneja et al. |
| 2015/0255427 A1* | 9/2015 | Sung .................. H01L 25/0652 257/737 |
| 2015/0303174 A1* | 10/2015 | Yu ....................... H01L 25/0657 257/712 |
| 2015/0357307 A1* | 12/2015 | Fu ......................... H01L 23/481 257/774 |

* cited by examiner

STACKED PACKAGE CONFIGURATIONS AND METHODS OF MAKING THE SAME

CLAIM OF PRIORITY UNDER 35 U.S.C. §119

The present Application for patent claims priority to Provisional Application No. 62/141,139 entitled "STACKED SEMICONDUCTOR CONFIGURATIONS AND METHODS OF MAKING THE SAME" filed Mar. 31, 2015, and assigned to the assignee hereof and hereby expressly incorporated by reference herein.

FIELD OF DISCLOSURE

This disclosure relates generally integrated packages, and more specifically, but not exclusively, high density package on package (PoP) integrated package configurations.

BACKGROUND

Memory dies are used in a wide variety of integrated package (e.g. semiconductor) applications. These integrated package applications may include a high Input/Output (IO) count (1000+ IO connections) instead of a normal IO count (100 IO connections). However, a high IO count generally includes a large area for the IO connections as well as extensive interconnections between the memory die and other components in the integrated package including other memory dies. To implement high IO count memory dies, like wide IO or high bandwidth memory (HBM), and the included interconnections in an integrated package for a specific target capacity (such as 4 GB using four 1 GB memory die), a through substrate via (TSV) is considered as a viable option since conventional PoP or side by side integrated packages have a limit on the number of IO counts due to the limited space available for the IO connections and interconnections. But implementing a TSV in an integrated package is a costly process as well as not being compatible with current business models. Thus, target capacity high IO memories would benefit from implementation in an integrated package without the use of TSVs.

Accordingly, there is a need for systems, apparatus, and methods provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a package on package may include: a first die located in a first plane; a second die located in a second plane with a first portion that extends past a first edge of the first die, the second plane located above the first plane; a third die located in the second plane with a second portion that extends past a second edge of the first die; a fourth die located in a third plane with a third portion that extends past a first edge of the second die, a first edge of the third die, and a third edge of the first die, the third plane located above the second plane; a fifth die located in the third plane with a fourth portion that extends past a second edge of the second die, a second edge of the third die, and a fourth edge of the first die; a first plurality of interconnects configured to couple the first portion of the second die to the first die; a second plurality of interconnects configured to couple the second portion of the third die to the first die; a third plurality of interconnects configured to couple the third portion of the fourth die to the first die; and a fourth plurality of interconnects configured to couple the fourth portion of the fifth die to the first die.

In another aspect, A package on package may include: a first die located in a first plane; a second die located in a second plane with a first portion that extends past a first edge of the first die, the second plane located above the first plane; a third die located in the second plane with a second portion that extends past a second edge of the first die; a fourth die located in a third plane with a third portion that extends past a first edge of the second die, a first edge of the third die, and a third edge of the first die, the third plane located above the second plane; a fifth die located in the third plane with a fourth portion that extends past a second edge of the second die, a second edge of the third die, and a fourth edge of the first die; a first means of interconnection for coupling the first portion of the second die to the first die; a second means of interconnection for coupling the second portion of the third die to the first die; a third means of interconnection for coupling the third portion of the fourth die to the first die; and a fourth means of interconnection for coupling the fourth portion of the fifth die to the first die.

In still another aspect, a method for manufacturing a package on package may include: forming a substrate with a first plurality of pads along a front side perimeter of the substrate, a second plurality of pads along a back side perimeter of the substrate, a third plurality of pads along a third side perimeter of the substrate, and a fourth plurality of pads along a fourth side perimeter of the substrate; mounting a first die on a first side of the substrate; placing a first plurality of second plane interconnects on the first plurality of pads; placing a second plurality of second plane interconnects on the second plurality of pads; mounting a second die above the first die in a second plane with a portion that extends past a perimeter of the first die and connected to the first plurality of second plane interconnects; mounting a third die above the first die in the second plane proximate to the second die with a portion that extends past the perimeter of the first die and connected to the second plurality of second plane interconnects; placing a first portion of a first plurality of third plane interconnects in the fourth plurality of pads and a first portion of a second plurality of third plane interconnects in the third plurality of pads; placing a second portion of the first plurality of third plane interconnects on the first portion of the first plurality of third plane interconnects and a second portion of the second plurality of third plane interconnects on the first portion of the second plurality of third plane interconnects; mounting a fourth die on a first side of the second die and a first side of the third die in a third plane with a portion that extends past a perimeter of the second die and a perimeter of the third die; and mounting a fifth die a first side of the second die and a first side of the third die in the third plane proximate to the fourth die with a portion that extends past the perimeter of the second die and the perimeter of the third die.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the long-felt industry needs, as well as other previously unidentified needs, and mitigate shortcomings of the conventional methods, apparatus, and systems. For instance, some examples described herein illustrate PoP integrated package configurations with multiple top planes having multiple die in each top plane without the use of TSVs for die interconnections.

Figure 1:
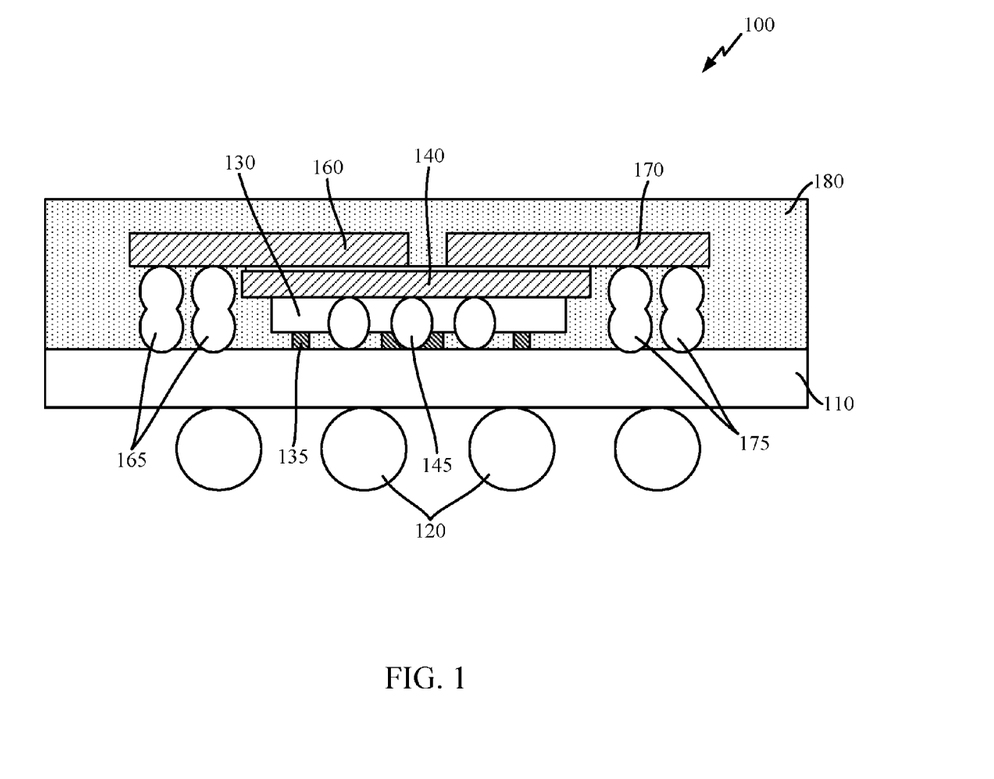
FIG. 1 illustrates an exemplary PoP integrated package configuration with a single mold layer in accordance with some examples of the disclosure.

FIG. 1 illustrates an exemplary PoP integrated package configuration with a single mold layer in accordance with some examples of the disclosure. As shown in FIG. 1, a PoP integrated package configuration 100 may include a substrate 110 having a first plurality of solder balls 120 on a second side thereof for external connections, a first die 130 (e.g. a logic die) located above a first side of the substrate 110 in a first plane, a second die 140 (e.g. a memory die) located above the first die 130 in a second plane with a portion extending past a perimeter of the first die 130 and having a first plurality of second plane interconnects 145 (e.g. solder balls, pads, traces, vias, pillars, electrical conductors etc.) for connection to the substrate 110 and the first die 130, a third die 150 (e.g. a memory die, not shown in FIG. 1) located above the first die 130 in the second plane adjacent to the second die 140 with a portion extending past a perimeter of the first die 130 and having a second plurality of second plane interconnects 155 (not shown) for connection to the substrate 110 and the first die 130, a fourth die 160 (e.g. a memory die) located above the second die 140 and the third die 150 in a third plane with a portion extending past a perimeter of the second die 140 and the third die 150 and having a first plurality of third plane interconnects 165 for connection to the substrate 110 and the first die 130, a fifth die 170 (e.g. a memory die) located above the second die 140 and the third die 150 in the third plane adjacent to the fourth die 160 with a portion extending past a perimeter of the second die 140 and the third die 150 and having a second plurality of third plane interconnects 175 for connection to the substrate 110 and the first die 130, and a first mold layer 180 encapsulating the portion of the PoP integrated package configuration 100 on the first side of the substrate 110.

The substrate 110 may be a substrate (e.g. silicon, other crystalline inorganic solids), an interposer, a laminated substrate, or a high density fan out substrate. The first plurality of solder balls 120 may be solder balls, such as a ball grid array, or other suitable materials for external connection of the PoP integrated package configuration 100. The first plurality of second plane interconnects 145, the second plurality of second plane interconnects 155, the first plurality of third plane interconnects 165, and the second plurality of third plane interconnects 175 may be solder balls, pads, traces, vias, pillars, electrical conductors or other suitable materials for connecting the dies 140, 150, 160, and 170 to the substrate 110 and the first die 130 through the substrate 110 and substrate interconnects 135. While this configuration shows memory dies 140, 150, 160, and 170, these dies may be other logic dies or integrated circuit components that include interconnections to the substrate 110. While this configuration shows the first plurality of third plane interconnects 165 and the second plurality of third plane interconnects 175 as two separate columns of interconnects, it should be understood that it may have a single column or more than two columns. As shown, the PoP integrated package configuration 100 includes multiple dies in the second and third planes that extend past the die in the plane underneath.

Figure 2:
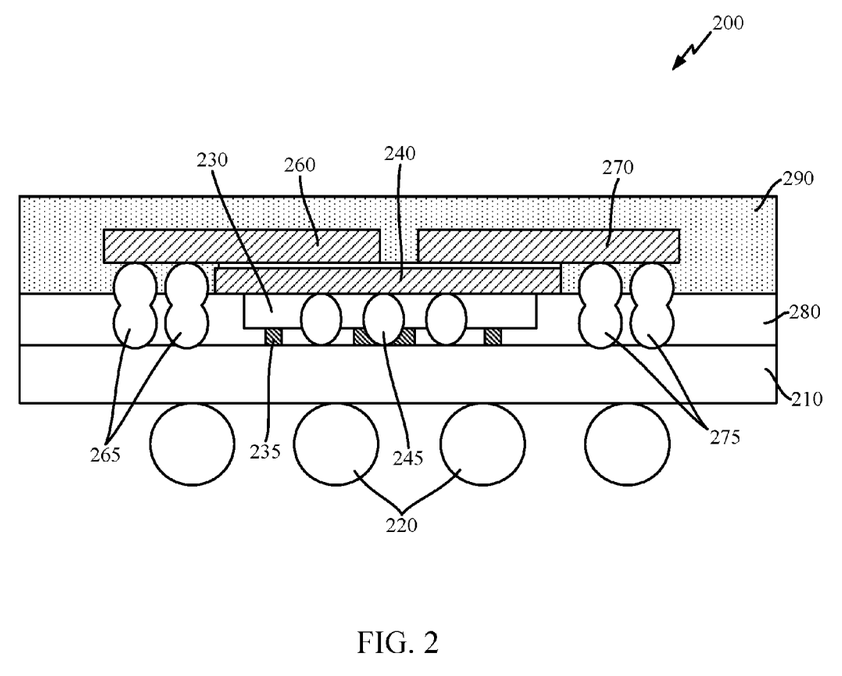
FIG. 2 illustrates an exemplary PoP integrated package configuration with two mold layers in accordance with some examples of the disclosure.

FIG. 2 illustrates an exemplary PoP integrated package configuration that incorporates all the details of the configuration in FIG. 1 except with two mold layers instead of one. As shown in FIG. 2, a PoP integrated package configuration 200 may include a substrate 210, a first die 230 located above the substrate 210 in a first plane, a second die 240 located above the first die 230 in a second plane, a third die 250 (not shown in FIG. 2) located above the first die 230 in the second plane proximate to the second die 240, a fourth die 260 located above the second die 240 and the third die 250 in a third plane, a fifth die 270 located above the second die 240 and the third die 250 in a third plane proximate to the fourth die 260, a first mold layer 280 encapsulating the first die 230, and a second mold layer 290 on the first mold layer 280 encapsulating the second die 240, the third die 250, the fourth die 260, and the fifth die 270. The first plurality of second plane interconnects 245, the second plurality of second plane interconnects 255, the first plurality of third plane interconnects 265, and the second plurality of third plane interconnects 275 may be suitable for connecting the dies 240, 250, 260, and 270 to the substrate 210 and the first die 230 through the substrate 210 and substrate interconnects 235. Alternatively and as shown in FIG. 7D below, the first mold layer 280 may at least partially encapsulate the first die 230, the second die 240 and the third die 250.

Figure 3:
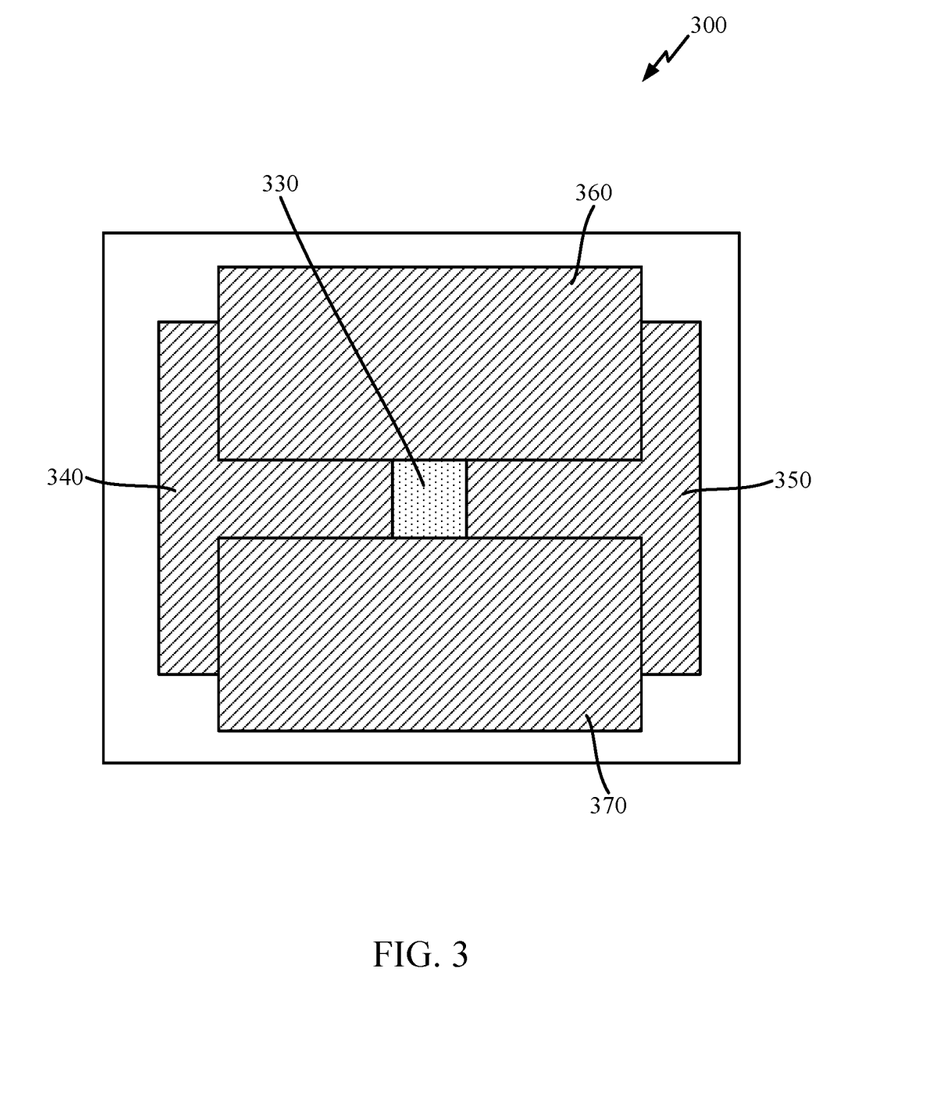
FIG. 3 illustrates a top down view of an exemplary PoP integrated package configuration in accordance with some examples of the disclosure.

FIG. 3 illustrates a top down view of an exemplary PoP integrated package configuration in accordance with some examples of the disclosure. As shown in FIG. 3, a PoP integrated package configuration 300 may include a substrate 310, a first die 330 located above a first side of the substrate 310 in a first plane and centrally located within a perimeter of substrate 310, a second die 340 located above a first side of the first die 330 in a second plane with a portion extending past a perimeter of the first die 330 but within the perimeter of the substrate 310, a third die 350 (e.g. die 150, die 250, die 450, die 550) located above the first side of the first die 330 in the second plane proximate to the second die 340 with a portion extending past the perimeter of the first die 330 but within the perimeter of the substrate 310, a fourth die 360 located above a first side of the second die 340 and the third die 350 in a third plane with a portion extending past the perimeter of the second die 340 and the third die 350 but within the perimeter of the substrate 310, and a fifth die 370 located above the second die 340 and the third die 350 in the third plane proximate to the fourth die 360 with a portion extending past the perimeter of the second die 340 and the third die 350 but within the perimeter of the substrate 310.

Figure 4:
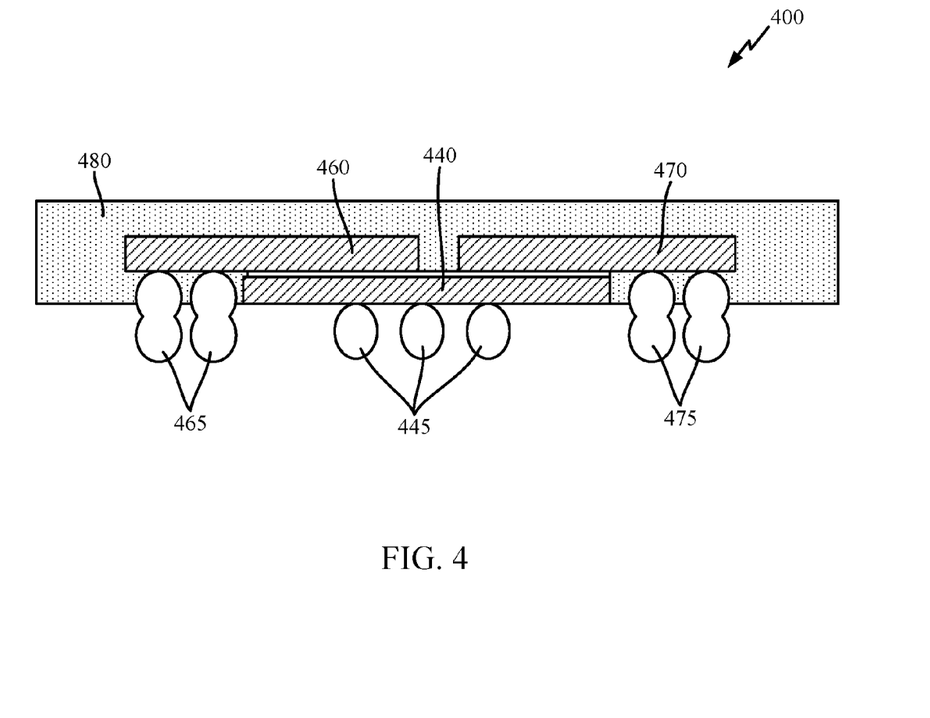
FIG. 4 illustrates an exemplary top package for a PoP integrated package configuration in accordance with some examples of the disclosure.

FIG. 4 illustrates an exemplary top package for a PoP integrated package configuration in accordance with some examples of the disclosure. As shown in FIG. 4, a pre-formed top package 400 for a PoP integrated package configuration may include a second die 440 in a second plane with a first plurality of second plane interconnects 445 for eventual connection to a substrate (not shown), a third die 450 (not shown in FIG. 4) in the second plane proximate to the second die 440 with a second plurality of second plane interconnects 455 (not shown) for connection to the substrate (not shown), a fourth die 460 located above a first side of the second die 440 and the third die 450 in a third plane with a portion extending past a perimeter of the second die 440 and the third die 450 and having a first plurality of third plane interconnects 465 for connection to the substrate (not shown), a fifth die 470 located above the second die 440 and the third die 450 in the third plane proximate to the fourth die 460 with a portion extending past a perimeter of the second die 440 and the third die 450 and having a second plurality of third plane interconnects 475 for connection to the substrate (not shown), and a first mold layer 480 encapsulating the second die 440, the third die 450, the fourth die 460, and the fifth die 470. By pre-forming the top package 400 before attachment to a bottom package, the top package 400 may be easier to construct and reduce the cost of forming the top package during formation of the bottom package.

Figure 5:
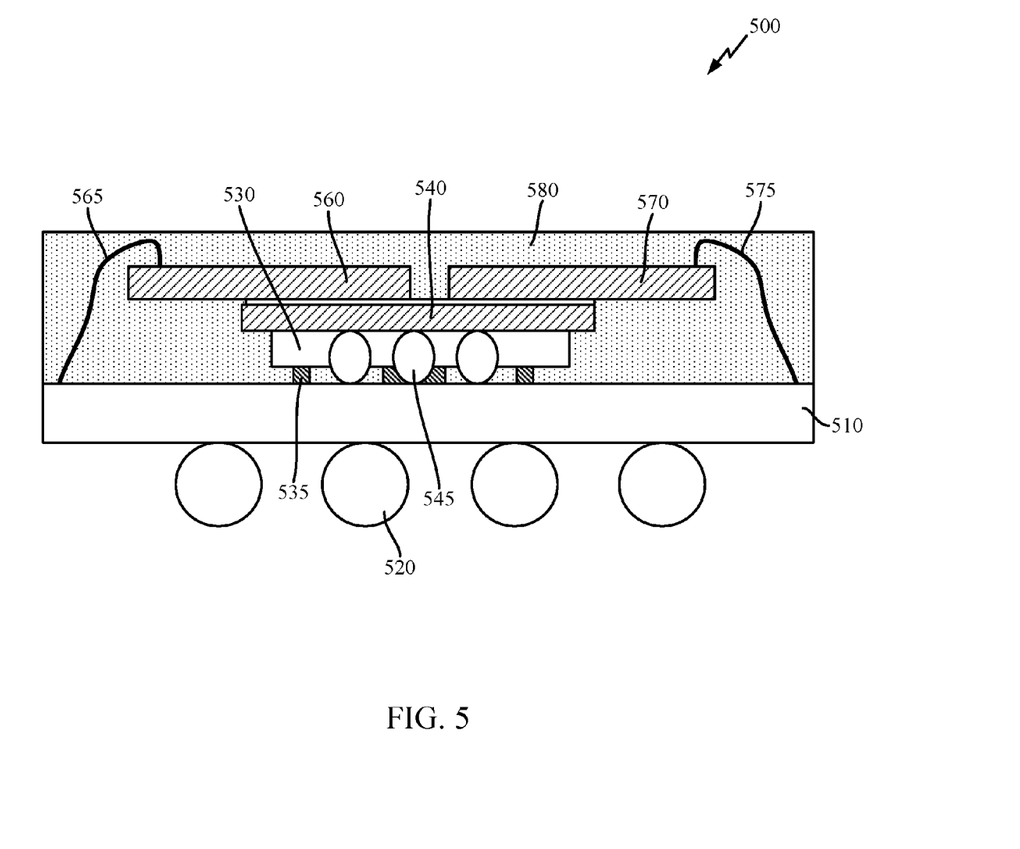
FIG. 5 illustrates an exemplary PoP integrated package configuration with wire bonding in accordance with some examples of the disclosure.

FIG. 5 illustrates an exemplary PoP integrated package configuration with wire bonding in accordance with some examples of the disclosure. As shown in FIG. 5, a PoP integrated package configuration 500 may include a substrate 510 having a first plurality of solder balls 520 on a second side thereof for external connections, a first die 530 located above a first side of the substrate 510 in a first plane, a second die 540 located above a first side of the first die 530 in a second plane with a portion extending past a perimeter of the first die 530 and having a first plurality of second plane interconnects 545 for connection to the substrate 510, a third die 550 (not shown in FIG. 5) located above the first side of the first die 530 in a second plane proximate to the second die 540 with a portion extending past a perimeter of the first die 530 and having a second plurality of second plane interconnects 555 (not shown) for connection to the substrate 510, a fourth die 560 located above a first side of the second die 540 and the third die 550 in a third plane with a portion extending past a perimeter of the second die 540 and the third die 550 and having a first plurality of third plane wire bond interconnects 565 for connection to the substrate 510, a fifth die 570 located above the second die 540 and the third die 550 in a third plane proximate to the fourth die 560 with a portion extending past a perimeter of the second die 540 and the third die 550 and having a second plurality of third plane wire bond interconnects 575 for connection to the substrate 510, and a first mold layer 580 encapsulating the portion of the PoP integrated package configuration 500 on the first side of the substrate 510.

The substrate 510 may be a silicon substrate, an interposer, a laminated substrate, or a high density fan out substrate. The first plurality of solder balls 520 may be solder balls, such as a ball grid array, or other suitable materials for external connection of the PoP integrated package configuration 500. The first plurality of second plane interconnects 545, the second plurality of second plane interconnects 555, the first plurality of third plane wire bond interconnects 565, and the second plurality of third plane wire bond interconnects 575 may be suitable for connecting the dies 540, 550, 560, and 570 to the substrate 510 and the first die 530 through the substrate 510 and substrate interconnects 535. The first plurality of second plane interconnects 545, the second plurality of second plane interconnects 555 may be solder balls, pre-formed copper pillars, copper plated columns, or other suitable materials for connecting the dies 540 and 550 to the substrate 510. The first plurality of third plane wire bond interconnects 565 and the second plurality of third plane wire bond interconnects 575 may be electrically conductive wire or other suitable materials for connecting the dies 560 and 570 to the substrate 510. While this configuration shows memory dies 540, 550, 560, and 570, these dies may be other logic dies or integrated circuit components that include interconnections to the substrate 510. While this configuration shows the first plurality of third plane interconnects 565 and the second plurality of third plane interconnects 575 as a single wire, it should be understood that it may have more than one wire. As shown, the PoP integrated package configuration 500 includes multiple dies in the second and third planes that extend past the die in the plane underneath.

Figure 6:
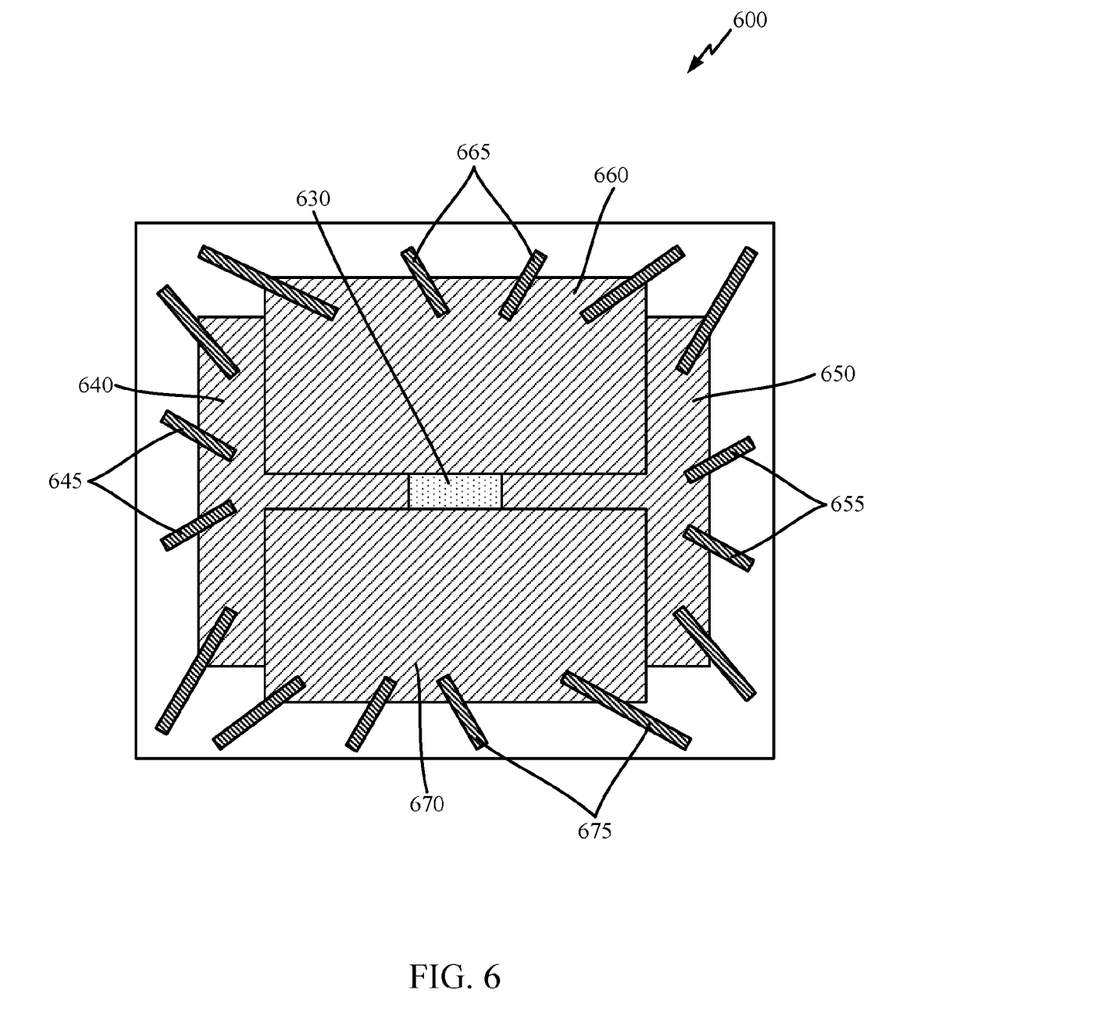
FIG. 6 illustrates a top down view of an exemplary PoP integrated package configuration with wire bonding in accordance with some examples of the disclosure.

FIG. 6 illustrates a top down view of an exemplary PoP integrated package configuration with wire bonding in accordance with some examples of the disclosure. As shown in FIG. 6, a PoP integrated package configuration 600 may include a substrate 610, a first die 630 located above a first side of the substrate 610 in a first plane and centrally located within a perimeter of substrate 610, a second die 640 located above a first side of the first die 630 in a second plane with a portion extending past a perimeter of the first die 630 but within the perimeter of the substrate 610 and having a first plurality of second plane wire bond interconnects 645 for connection to the substrate 610, a third die 650 located above the first side of the first die 630 in the second plane proximate to the second die 640 with a portion extending past the perimeter of the first die 630 but within the perimeter of the substrate 610 and having a the second plurality of second plane wire bond interconnects 655 (e.g. interconnects 155, interconnects 455, and interconnects 555) for connection to the substrate 610, a fourth die 660 located above a first side of the second die 640 and the third die 650 in a third plane with a portion extending past the perimeter of the second die 640 and the third die 650 but within the perimeter of the substrate 610 and having a first plurality of third plane wire bond interconnects 665 for connection to the substrate 610, and a fifth die 670 located above the second die 640 and the third die 650 in the third plane proximate to the fourth die 660 with a portion extending past the perimeter of the second die 640 and the third die 650 but within the perimeter of the substrate 610 and having a second plurality of third plane wire bond interconnects 675 for connection to the substrate 610.

Figure 7A:
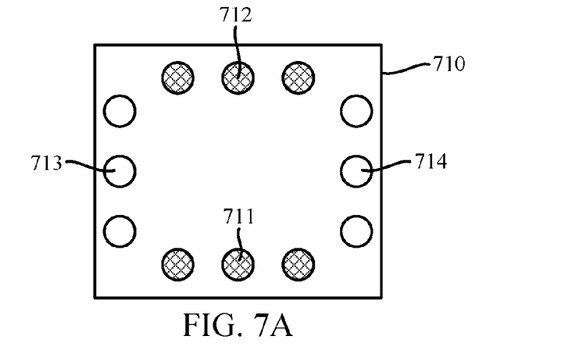
FIGS. 7A-G illustrate an exemplary partial process flow for a PoP integrated package configuration with two mold layers in accordance with some examples of the disclosure.
Figure 7B:
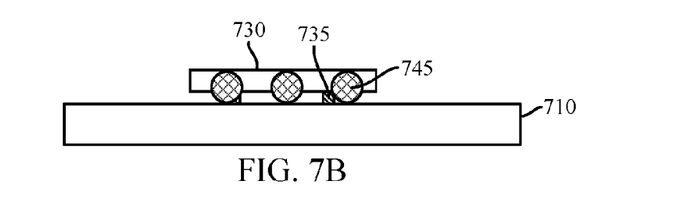
Figure 7C:
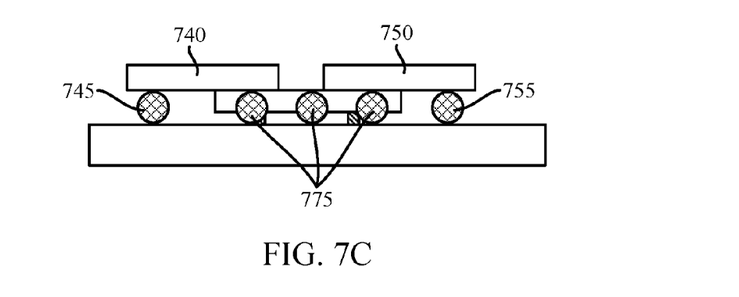
Figure 7D:
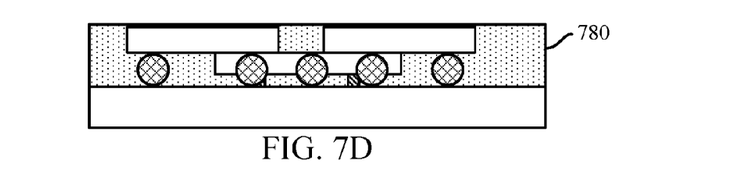

FIGS. 7A-G illustrate an exemplary partial process flow for a PoP integrated package configuration with two mold layers in accordance with some examples of the disclosure. As shown in FIG. 7A, the partial process begins with a substrate 710 having a first plurality of pads 711 along a front side perimeter of the substrate 710, a second plurality of pads 712 along a back side perimeter of the substrate 710, a third plurality of pads 713 along a third side perimeter of the substrate 710, and a fourth plurality of pads 714 along a fourth side perimeter of the substrate 710. As shown in FIG. 7B, the process continues with mounting a first die 730 on a first side of the substrate 710 followed by placement of a first plurality of second plane interconnects 745 in the first plurality of pads 711 and the placement of a second plurality of second plane interconnects 755 in the second plurality of pads 712. The first plurality of second plane interconnects 745, the second plurality of second plane interconnects 755 (e.g. interconnects 155, interconnects 455, and interconnects 555), the first plurality of third plane interconnects 765 (not shown), and the second plurality of third plane interconnects 775 (shown in FIG. 7F) may be suitable for connecting the dies 740, 750, 760, and 770 to the substrate 710 and the first die 730 through the substrate 710 and substrate interconnects 735.

Figure 7E:
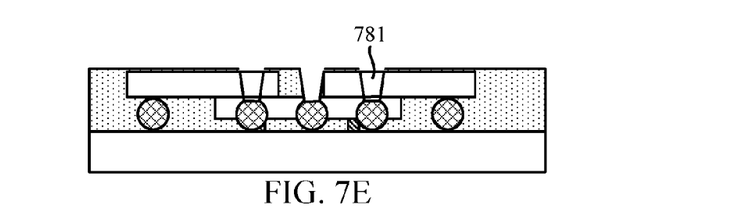

As shown in FIG. 7C, the process continues with mounting a second die 740 on a first side of the first die 730 in a second plane with a portion extending past a perimeter of the first die 730 and coupled to the first plurality of second plane interconnects 745, mounting a third die 750 on the first side of the first die 730 in the second plane proximate to the second die 740 with a portion extending past a perimeter of the first die 730 and connected to the second plurality of second plane interconnects 755, followed by placement of a portion of a first plurality of third plane interconnects 775 in the fourth plurality of pads 714 and a portion of a second plurality of third plane interconnects 765 (not shown) in the third plurality of pads 713. As shown in FIG. 7D, the process continues with the application of a first mold layer 780 on the first side of the substrate 710 encapsulating the components above the substrate 710. As shown in FIG. 7E, the process continues with formation of channels 781 in the first mold layer 780 from the mold layer 780 to the previously placed portions of the first plurality of third plane interconnects 775 and the second plurality of third plane interconnects 765 (not shown). The channels 781 may be formed by using a laser, mechanical drilling, photolithographic process, or similar method.

Figure 7F:
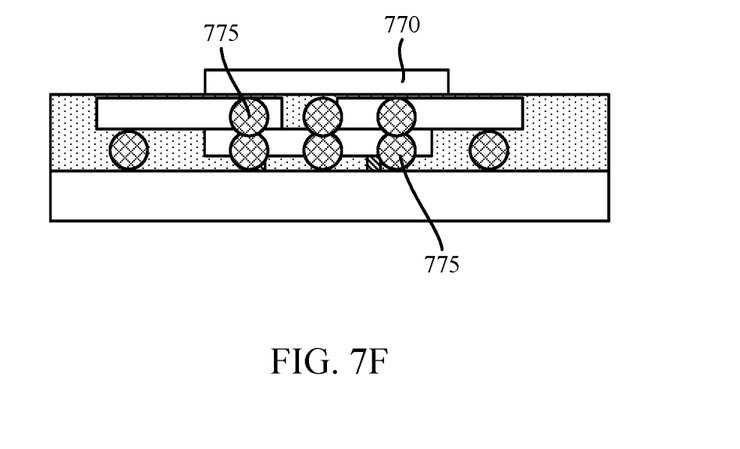
Figure 7G:
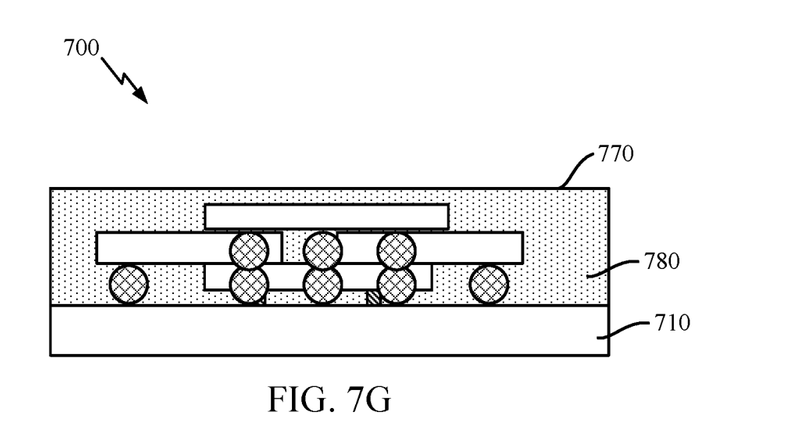

As shown in FIG. 7F, the process continues with placement of another portion of the first plurality of third plane interconnects 775 in the channels 781 and another portion of the second plurality of third plane interconnects 765 (not shown) in the channels 781 followed by mounting a fourth die 760 (not shown) on a first side of the second die 740 and the third die 750 in a third plane with a portion extending past a perimeter of the second die 740 and the third die 750 with the first plurality of third plane interconnects 765 (not shown) connecting to the substrate 710, and mounting a fifth die 770 on the second die 740 and the third die 750 in the third plane proximate to the fourth die 760 with a portion extending past a perimeter of the second die 740 and the third die 750 with the second plurality of third plane interconnects 775 connecting to the substrate 710. As shown, the first plurality of third plane interconnects 775 and the second plurality of third plane interconnects 765 are formed in a two-action process using the channels 781 instead of a single action. One benefit of using channels 781 as the second action in the two-action process is that it allows the second portion of the first plurality of third plane interconnects 775 and the second portion of the second plurality of third plane interconnects 765 to vary a height of the second portions to account for variances in the formation of the first portion while still achieving the desired overall height for connection to the third plane dies without any gaps or excess that may be caused by process variations. As shown in FIG. 7G, the partial process concludes with application of a second mold layer 790 on the first mold layer 780 encapsulating the fourth die 760 and the fifth die 770.

Figure 8A:
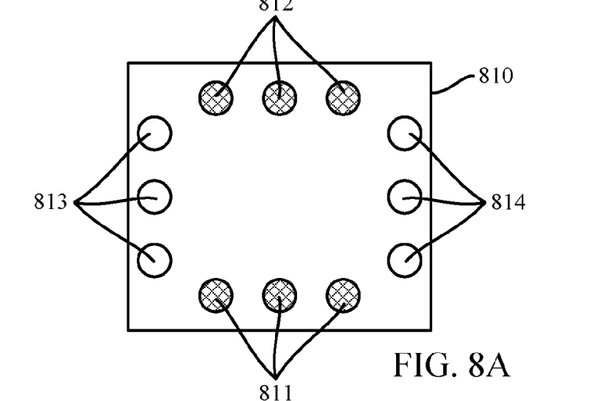
FIGS. 8A-E illustrate an exemplary partial process flow for a PoP integrated package configuration with a single mold layer in accordance with some examples of the disclosure.
Figure 8B:
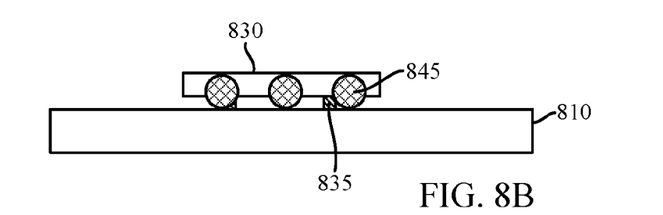

FIGS. 8A-E illustrate an exemplary partial process flow for a PoP integrated package configuration with a single mold layer in accordance with some examples of the disclosure. As shown in FIG. 8A, the partial process begins with a substrate 810 having a first plurality of pads 811 along a front side perimeter of the substrate 810, a second plurality of pads 812 along a back side perimeter of the substrate 810, a third plurality of pads 813 along a third side perimeter of the substrate 810, and a fourth plurality of pads 814 along a fourth side perimeter of the substrate 810. As shown in FIG. 8B, the process continues with mounting a first die 830 on a first side of the substrate 810 followed by placement of a first plurality of second plane interconnects 845 in the first plurality of pads 811 and the placement of a second plurality of second plane interconnects 855 in the second plurality of pads 812. The first plurality of second plane interconnects 845, the second plurality of second plane interconnects 855 (e.g. interconnects 155, interconnects 455, and interconnects 555), the first plurality of third plane interconnects 865 (e.g. interconnects 165, interconnects 465, interconnects 565, interconnects 665, and interconnects 765), and the second plurality of third plane interconnects 875 (shown in FIG. 8D) may be suitable for connecting the dies 840, 850, 860 (e.g. die 160, die 260, die 360, die 460, die 560, die 660, and die 760), and 870 to the substrate 810 and the first die 830 through the substrate 810 and substrate interconnects 835.

Figure 8C:
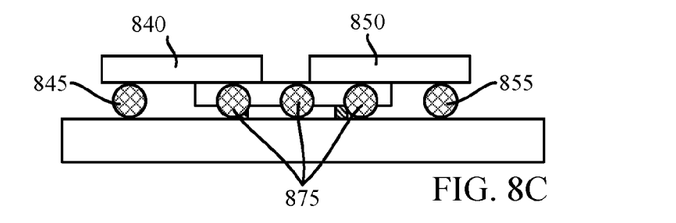
Figure 8D:
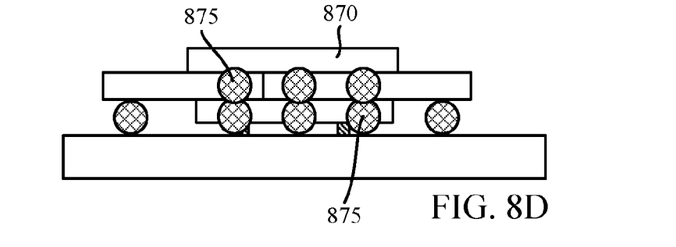
Figure 8E:
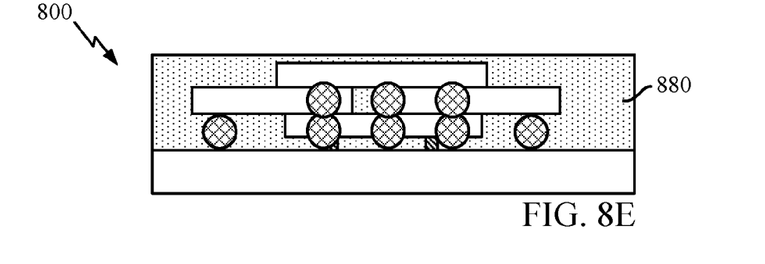

As shown in FIG. 8C, the process continues with mounting a second die 840 on a first side of the first die 830 in a second plane with a portion extending past a perimeter of the first die 830 and connected to the first plurality of second plane interconnects 845, mounting a third die 850 on the first side of the first die 830 in the second plane proximate to the second die 840 with a portion extending past a perimeter of the first die 830 and connected to the second plurality of second plane interconnects 855, followed by placement of a portion of a first plurality of third plane interconnects 875 in the fourth plurality of pads 814 and a portion of a second plurality of third plane interconnects 865 (not shown) in the third plurality of pads 813. As shown in FIG. 8D, the process continues with placement of another portion of the first plurality of third plane interconnects 875 and another portion of the second plurality of third plane interconnects 865 (not shown) followed by mounting a fourth die 860 (not shown) on a first side of the second die 840 and the third die 850 in a third plane with a portion extending past a perimeter of the second die 840 and the third die 850 with the first plurality of third plane interconnects 865 (not shown) connecting to the substrate 810, and mounting a fifth die 870 on the second die 840 and the third die 850 in the third plane proximate to the fourth die 860 with a portion extending past a perimeter of the second die 840 and the third die 850 with the second plurality of third plane interconnects 875 connecting to the substrate 810. As shown in FIG. 8E, the partial process concludes with application of a first mold layer 880 on the substrate 810 encapsulating the portion of the PoP integrated package configuration on the first side of the substrate 810.

Figure 9:
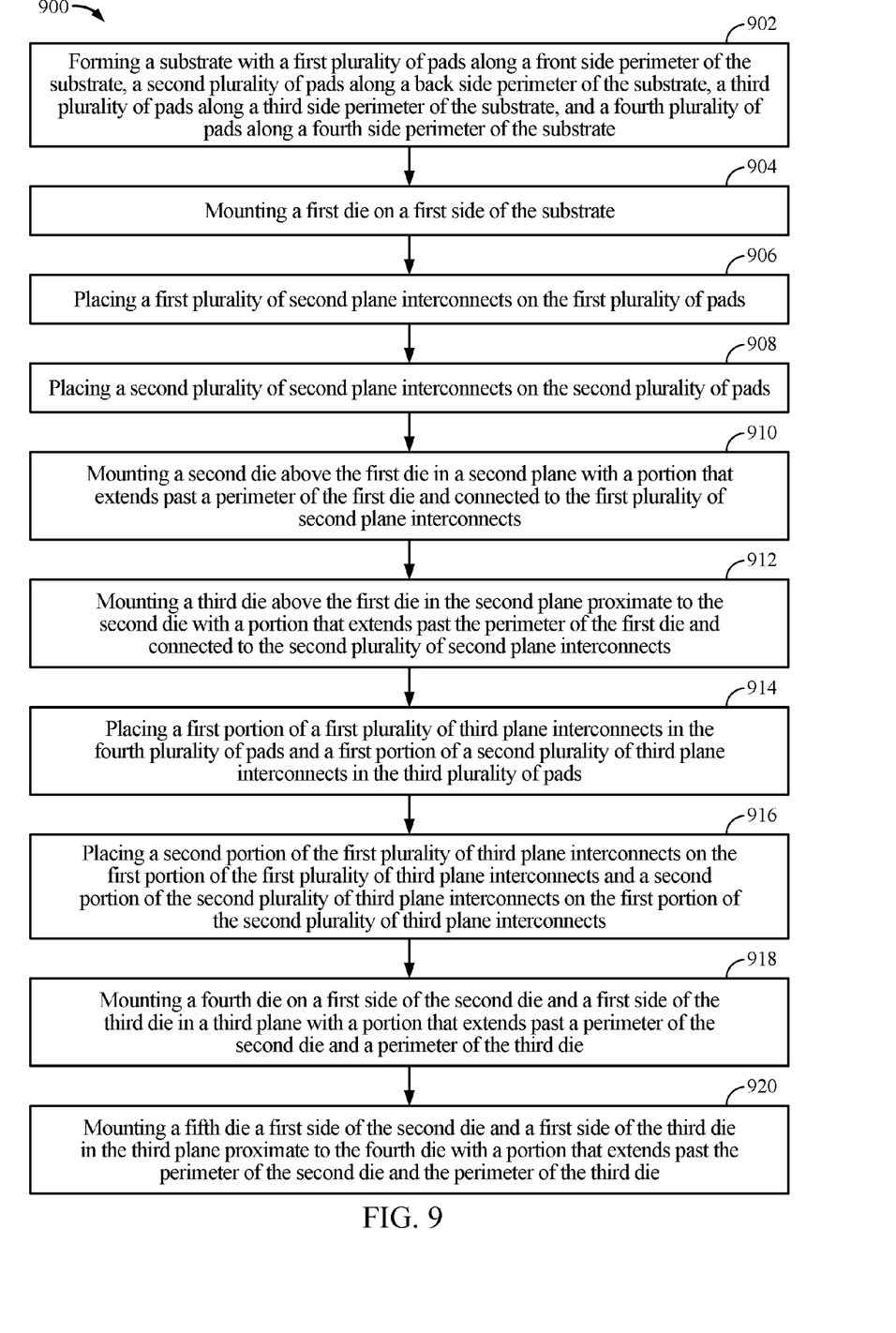
FIG. 9 illustrates an exemplary block diagram of a partial process flow for manufacturing a PoP integrated package configuration in accordance with some examples of the disclosure.

FIG. 9 illustrates an exemplary partial method 900 for manufacturing a package on package configuration. As shown in block 902, the method begins with forming a substrate with a first plurality of pads along a front side perimeter of the substrate, a second plurality of pads along a back side perimeter of the substrate, a third plurality of pads along a third side perimeter of the substrate, and a fourth plurality of pads along a fourth side perimeter of the substrate. In block 904, the method continues with mounting a first die on a first side of the substrate. In block 906, the method continues with placing a first plurality of second plane interconnects on the first plurality of pads. In block 908, the method continues with placing a second plurality of second plane interconnects on the second plurality of pads. In block 910, the method continues with mounting a second die above the first die in a second plane with a portion that extends past a perimeter of the first die and connected to the first plurality of second plane interconnects. In block 912, the method continues with mounting a third die above the first die in the second plane proximate to the second die with a portion that extends past the perimeter of the first die and connected to the second plurality of second plane interconnects. In block 914, the method continues with placing a first portion of a first plurality of third plane interconnects in the fourth plurality of pads and a first portion of a second plurality of third plane interconnects in the third plurality of pads. In block 916, the method continues with placing a second portion of the first plurality of third plane interconnects on the first portion of the first plurality of third plane interconnects and a second portion of the second plurality of third plane interconnects on the first portion of the second plurality of third plane interconnects. In block 918, the method continues with mounting a fourth die on a first side of the second die and a first side of the third die in a third plane with a portion that extends past a perimeter of the second die and a perimeter of the third die. In block 920, the partial method concludes with mounting a fifth die a first side of the second die and a first side of the third die in the third plane proximate to the fourth die with a portion that extends past the perimeter of the second die and the perimeter of the third die.

It should furthermore be noted that the apparatus and methods disclosed in the description or in the claims can be implemented by a device comprising means for performing respective actions of the apparatus or method. For example, a PoP integrated package configuration may include a substrate, a first die (e.g. first die 130, first die 230, first die 330, first die 430, first die 530, first die 630, first die 730, and first die 830) located above the substrate in a first plane, a second die (e.g. second die 140, second die 240, second die 340, second die 440, second die 540, second die 640, second die 740, and second die 840) located above the first die in a second plane with a portion extending past a perimeter of the first die and having a first means of interconnection for coupling a first portion of the second die to the first die (The first means of interconnection may comprise, for example, solder balls, pads, traces, vias, pillars, electrical conductors, or similar structure for coupling the first portion of the second die to the first die, such as first plurality of interconnects 145, first plurality of interconnects 445, first plurality of interconnects 545, first plurality of interconnects 645, first plurality of interconnects 745, and first plurality of interconnects 845), a third die (e.g. third die 150, third die 250, third die 350, third die 450, third die 550, third die 650, third die 750, and third die 850) located above the first die in the second plane with a portion extending past a perimeter of the first die and having a second means of interconnection for coupling the second portion of the third die to the first die (The second means of interconnection may comprise, for example, solder balls, pads, traces, vias, pillars, electrical conductors, or similar structure for coupling the second portion of the third die to the first die, such as second plurality of second plane interconnects 155, second plurality of second plane interconnects 455, second plurality of second plane interconnects 555, second plurality of second plane interconnects 655, second plurality of second plane interconnects 755, and second plurality of second plane interconnects 855), a fourth die 160 (e.g. fourth die 160, fourth die 260, fourth die 360, fourth die 460, fourth die 560, fourth die 660, fourth die 760, and fourth die 860) located above the second die and the third die in a third plane with a portion extending past a perimeter of the second die and the third die and having a third means of interconnection for coupling the third portion of the fourth die to the first die (The third means of interconnection may comprise, for example, solder balls, pads, traces, vias, pillars, electrical conductors, or similar structure for coupling the third portion of the fourth die to the first die, such as first plurality of third plane interconnects 165, first plurality of third plane interconnects 465, first plurality of third plane interconnects 565, first plurality of third plane interconnects 665, first plurality of third plane interconnects 765, and first plurality of third plane interconnects 865), a fifth die (e.g. fifth die 170, fifth die 270, fifth die 370, fifth die 470, fifth die 570, fifth die 670, fifth die 770, and fifth die 870) located above the second die and the third die in the third plane with a portion extending past a perimeter of the second die and the third die and having a fourth means of interconnection for coupling the fourth portion of the fifth die to the first die (The fourth means of interconnection may comprise, for example, solder balls, pads, traces, vias, pillars, electrical conductors, or similar structure for coupling the fourth portion of the fifth die to the first die, such as second plurality of third plane interconnects 175, second plurality of third plane interconnects 475, second plurality of third plane interconnects 575, second plurality of third plane interconnects 675, second plurality of third plane interconnects 775, and second plurality of third plane interconnects 875), and a first mold layer at least partially encapsulating the portion of the PoP integrated package configuration on the substrate.

Figure 10:
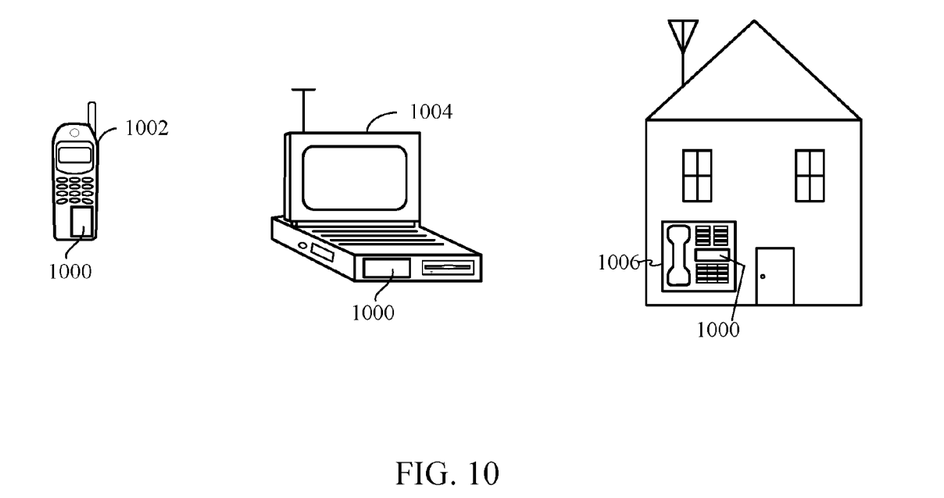
FIG. 10 illustrates an exemplary integrated device in accordance with some examples of the disclosure.

FIG. 10 illustrates various electronic devices that may be integrated with any of the aforementioned integrated device, semiconductor device, integrated circuit, die, interposer, package or package-on-package (PoP). For example, a mobile phone device 1002, a laptop computer device 1004, and a fixed location terminal device 1006 may include an integrated device 1000 as described herein. The integrated device 1000 may be, for example, any of the integrated circuits, dies, integrated devices, integrated device packages, integrated circuit devices, device packages, integrated circuit (IC) packages, package-on-package devices described herein. The devices 1002, 1004, 1006 illustrated in FIG. 10 are merely exemplary. Other electronic devices may also feature the integrated device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-10 may be rearranged and/or combined into a single component, process, feature or function or embodied in several components, processes, or functions. Additional elements, components, processes, and/or functions may also be added without departing from the disclosure. It should also be noted that FIGS. 1-10 and its corresponding description in the present disclosure is not limited to dies and/or ICs. In some implementations, FIGS. 1-10 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Likewise, the term "examples" does not mean that all examples include the discussed feature, advantage or mode of operation. Use of the terms "in one example," "an example," "in one feature," and/or "a feature" in this specification does not always refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements. In addition, terminology of the form "at least one of: A, B, or C" used in the description or the claims can be interpreted as "A or B or C or any combination of these elements."

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples include more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A package on package comprising:
   a first die located in a first plane;
   a second die directly mounted on the first die and located in a second plane with a first portion that extends past a first edge of the first die, the second plane located above the first plane;
   a third die directly mounted on the first die and located in the second plane with a second portion that extends past a second edge of the first die;
   a fourth die located in a third plane with a third portion that extends past a first edge of the second die, a first edge of the third die, and a third edge of the first die, the third plane located above the second plane;
   a fifth die located in the third plane with a fourth portion that extends past a second edge of the second die, a second edge of the third die, and a fourth edge of the first die;
   a first plurality of interconnects configured to couple the first portion of the second die to the first die;
   a second plurality of interconnects configured to couple the second portion of the third die to the first die;
   a third plurality of interconnects configured to couple the third portion of the fourth die to the first die; and
   a fourth plurality of interconnects configured to couple the fourth portion of the fifth die to the first die.

2. The package on package of claim 1, wherein the first plurality of interconnects, the second plurality of interconnects, the third plurality of interconnects, and the fourth plurality of interconnects comprise solder balls, and wherein the second die and the third die are mounted on the first die without an intervening substrate.

3. The package on package of claim 2, wherein the third plurality of interconnects and the fourth plurality of interconnects comprise two columns of solder balls each.

4. The package on package of claim 1, wherein the first plurality of interconnects, the second plurality of interconnects, the third plurality of interconnects, and the fourth plurality of interconnects are configured to couple to the first die without a through substrate via.

5. The package on package of claim 1, further comprising a first mold layer configured to at least partially encapsulate the first die, the second die, and the third die.

6. The package on package of claim 5, further comprising a second mold layer configured to at least partially encapsulate the fourth die and the fifth die.

7. The package on package of claim 1, wherein the package on package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further includes the device.

8. A package on package comprising:
   a first die located in a first plane;
   a second die directly mounted on the first die and located in a second plane with a first portion that extends past a first edge of the first die, the second plane located above the first plane;
   a third die directly mounted on the first die and located in the second plane with a second portion that extends past a second edge of the first die;
   a fourth die located in a third plane with a third portion that extends past a first edge of the second die, a first edge of the third die, and a third edge of the first die, the third plane located above the second plane;
   a fifth die located in the third plane with a fourth portion that extends past a second edge of the second die, a second edge of the third die, and a fourth edge of the first die;
   a first means of interconnection for coupling the first portion of the second die to the first die;
   a second means of interconnection for coupling the second portion of the third die to the first die;
   a third means of interconnection for coupling the third portion of the fourth die to the first die; and
   a fourth means of interconnection for coupling the fourth portion of the fifth die to the first die.

9. The package on package of claim 8, wherein the first means of interconnection, the second means of interconnection, the third means of interconnection, and the fourth means of interconnection comprise solder balls, and wherein the second die and the third die are mounted on the first die without an intervening substrate.

10. The package on package of claim 9, wherein the third means of interconnection and the fourth means of interconnection comprise two columns of solder balls each.

11. The package on package of claim 8, wherein the first means of interconnection, the second means of interconnection, the third means of interconnection, and the fourth means of interconnection couple to the first die without a through substrate via.

12. The package on package of claim 8, further comprising a first mold layer configured to at least partially encapsulate the first die, the second die, and the third die.

13. The package on package of claim 12, further comprising a second mold layer configured to at least partially encapsulate the fourth die and the fifth die.

14. The package on package of claim 8, wherein the package on package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further includes the device.

* * * * *